(12) United States Patent
Sano

(10) Patent No.: US 10,431,755 B2
(45) Date of Patent: Oct. 1, 2019

(54) DISPLAY DEVICE INCLUDING AN INSULATING SUBSTRATE WITH PIXELS DISPOSED ON A FIRST SURFACE

(71) Applicant: Japan Display Inc., Minato-ku (JP)

(72) Inventor: Takumi Sano, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/980,790

(22) Filed: May 16, 2018

(65) Prior Publication Data

US 2018/0366662 A1    Dec. 20, 2018

(30) Foreign Application Priority Data

Jun. 16, 2017    (JP) .................................. 2017-118592

(51) Int. Cl.
| | | |
|---|---|---|
| H01L 51/00 | (2006.01) | |
| B32B 3/26 | (2006.01) | |
| B32B 7/12 | (2006.01) | |
| B32B 9/04 | (2006.01) | |
| B32B 27/28 | (2006.01) | |
| B32B 27/36 | (2006.01) | |
| B32B 27/08 | (2006.01) | |
| H01L 27/32 | (2006.01) | |

(52) U.S. Cl.
CPC ............ *H01L 51/0097* (2013.01); *B32B 3/26* (2013.01); *B32B 7/12* (2013.01); *B32B 9/045* (2013.01); *B32B 27/08* (2013.01); *B32B 27/281* (2013.01); *B32B 27/36* (2013.01); *B32B 2307/206* (2013.01); *B32B 2457/206* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2003/0184704 A1* | 10/2003 | Akiyama | .......... G02F 1/133305 349/158 |
| 2011/0012845 A1* | 1/2011 | Rothkopf | ................ G06F 3/044 345/173 |
| 2011/0050657 A1* | 3/2011 | Yamada | .............. H01L 27/3293 345/204 |
| 2014/0295150 A1* | 10/2014 | Bower | ....................... C09J 5/00 428/201 |

(Continued)

FOREIGN PATENT DOCUMENTS

| | | |
|---|---|---|
| JP | 09-323483 | 12/1997 |
| JP | 2008-044823 | 2/2008 |

(Continued)

*Primary Examiner* — J. E. Schoenholtz
(74) *Attorney, Agent, or Firm* — Oblon, McClelland, Maier & Neustadt, L.L.P.

(57) ABSTRACT

According to one embodiment, a display device includes an insulating substrate including a first surface on which a plurality of pixels are disposed and a second surface on an opposite side to the first surface, a support substrate disposed on the second surface side of the insulating substrate and an adhesive layer located between the insulating substrate and the support substrate, and the display device includes a display area on which the plurality of pixels are arranged, and an end portion of the adhesive layer is located closer to the display area than an end portion of the insulating substrate.

12 Claims, 11 Drawing Sheets

(56) References Cited

U.S. PATENT DOCUMENTS

| | | | | |
|---|---|---|---|---|
| 2015/0236280 A1* | 8/2015 | Sakuishi | ................ | B32B 17/06 |
| | | | | 257/99 |
| 2016/0293884 A1* | 10/2016 | Zhang | ................ | H05B 33/0896 |
| 2017/0338250 A1* | 11/2017 | Yanaka | ............... | H01L 27/1225 |
| 2018/0120975 A1* | 5/2018 | Kim | ........................ | G06F 3/044 |

FOREIGN PATENT DOCUMENTS

| | | |
|---|---|---|
| JP | 2010-188411 | 9/2010 |
| JP | 2014-041187 | 3/2014 |

* cited by examiner

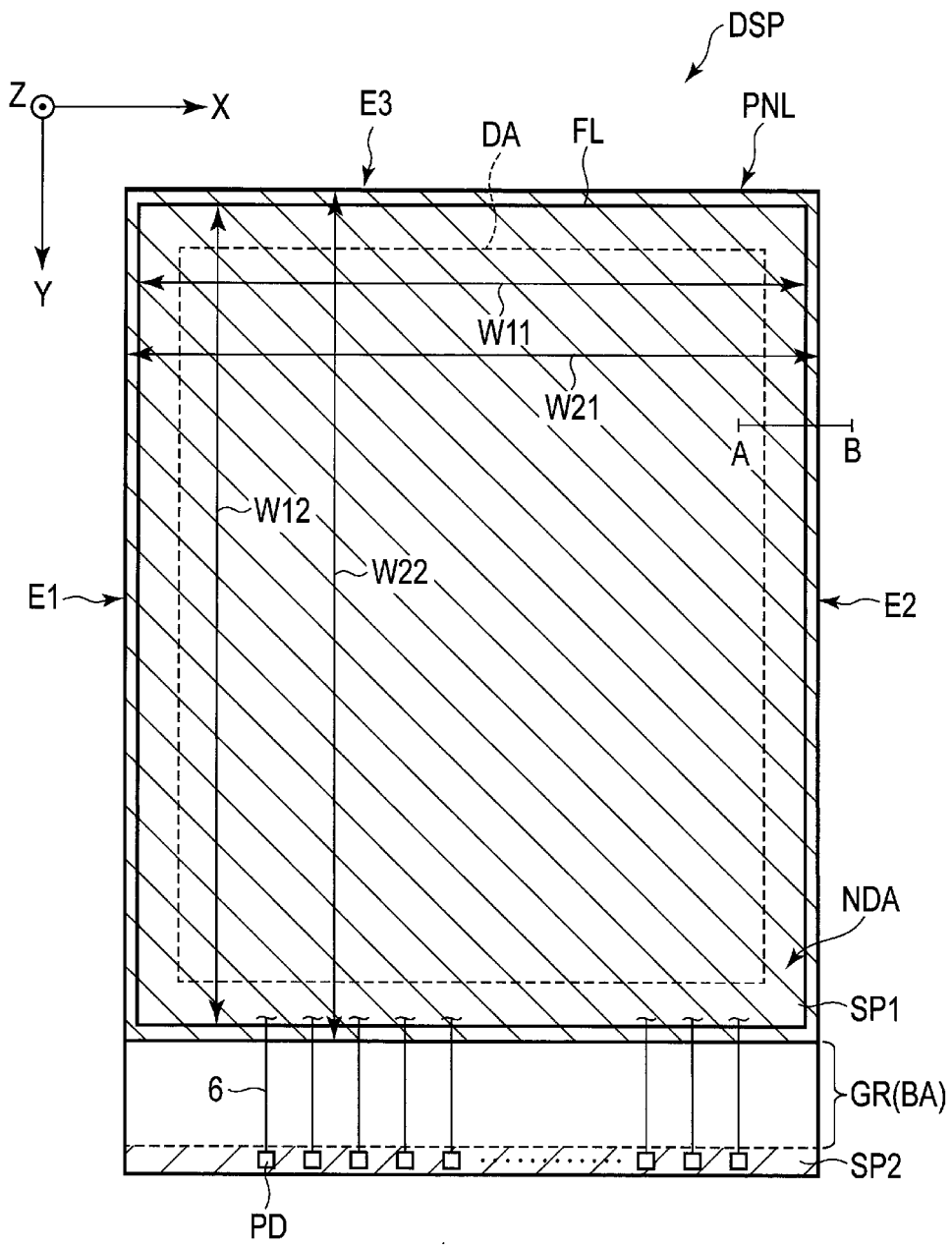
F I G. 3A

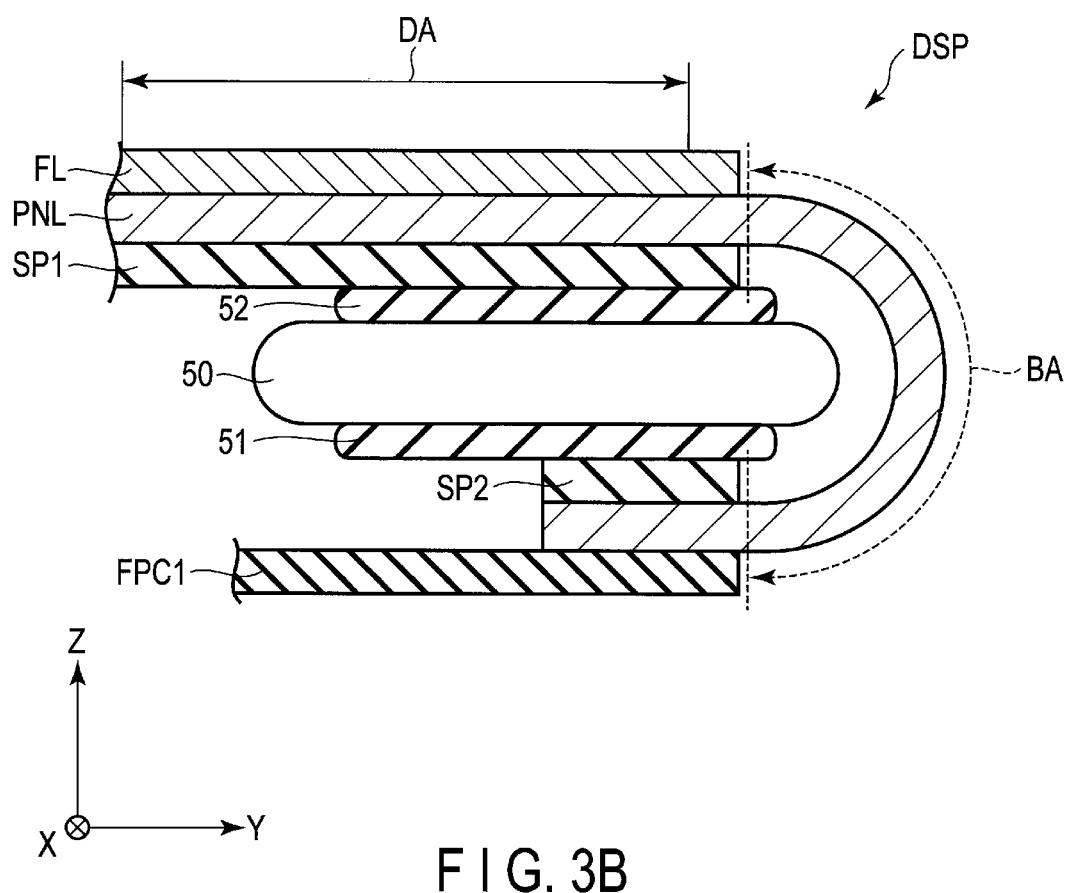
F I G. 3B

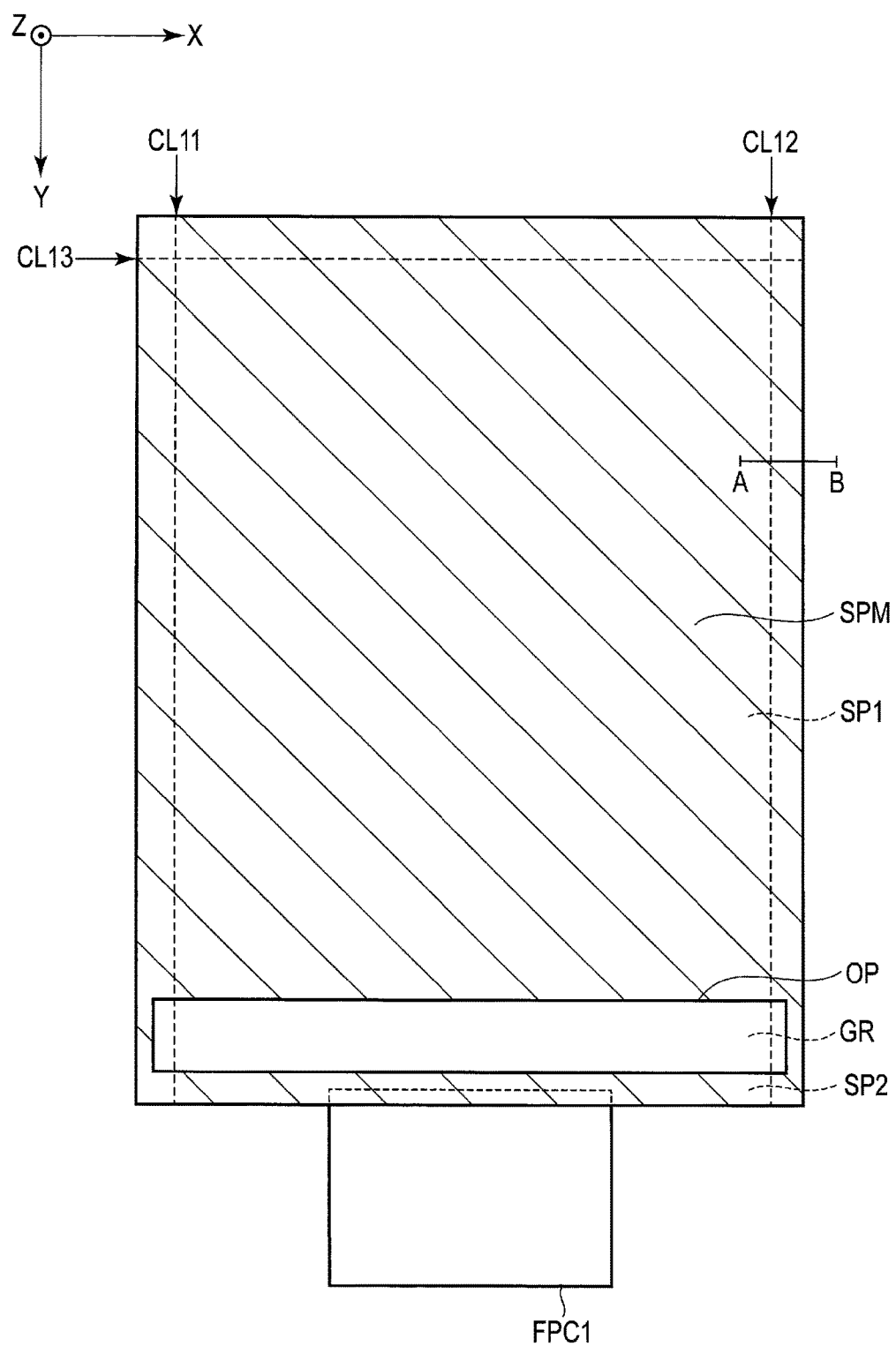
F I G. 7

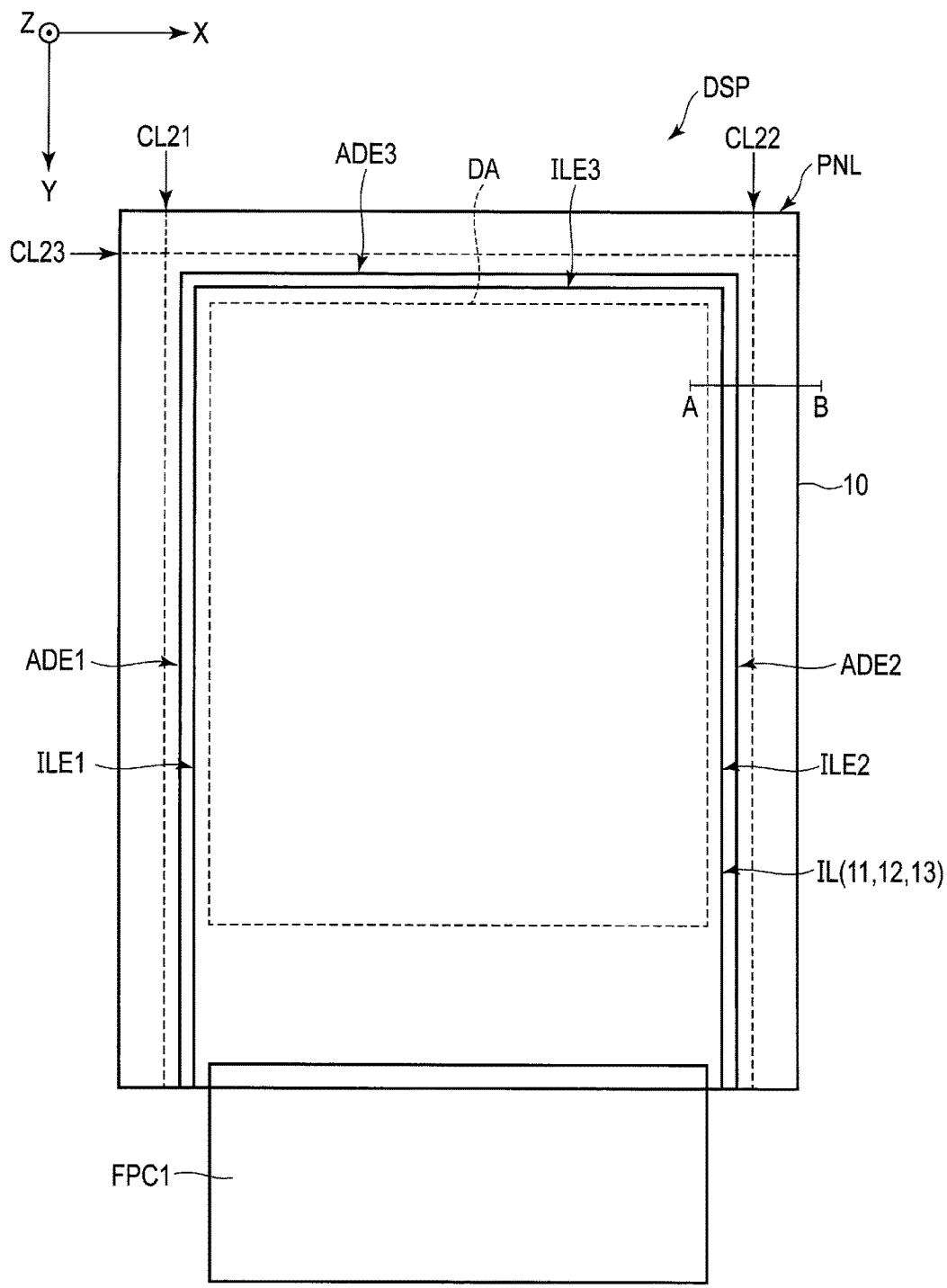
F I G. 9

DISPLAY DEVICE INCLUDING AN INSULATING SUBSTRATE WITH PIXELS DISPOSED ON A FIRST SURFACE

CROSS-REFERENCE TO RELATED APPLICATIONS

This application is based upon and claims the benefit of priority from Japanese Patent Application No. 2017-118592, filed Jun. 16, 2017, the entire contents of which are incorporated herein by reference.

FIELD

Embodiments described herein relate generally to a display device.

BACKGROUND

In recent years, display devices such as liquid crystal displays and organic electroluminescent display devices are used in various fields. As the base material for display devices, for example, a resin film is adopted. Here, such a technique is conventionally known that, for example, after stacking a functional layer such as a liquid crystal layer or a light-emitting layer on a resin film, a resin film medium is cut by a punching blade or a laser beam in order to obtain a resin film medium of a target size.

BRIEF DESCRIPTION OF THE DRAWINGS

FIG. 3A is a plan view showing a display panel according to this embodiment, which illustrates positions of a first support substrate and a second support substrate with regard to each other.

FIG. 3B is a diagram showing a state where a bend area is bent in the display device DSP according to this embodiment.

FIG. 7 shows a process of cutting a support substrate.

FIG. 9 shows a process of cutting an insulating substrate.

DETAILED DESCRIPTION

In general, according to one embodiment, a display device comprises an insulating substrate comprising a first surface on which a plurality of pixels are disposed and a second surface on an opposite side to the first surface, a support substrate disposed on the second surface side of the insulating substrate and an adhesive layer located between the insulating substrate and the support substrate, and the display device comprises a display area on which the plurality of pixels are arranged, and an end portion of the adhesive layer is located closer to the display area than an end portion of the insulating substrate.

An embodiment will be described hereinafter with reference to the accompanying drawings. Note that the disclosure is a mere example presented for the sake of exemplification, and any modification and variation conceived within the scope and spirit of the invention by a person having ordinary skill in the art are naturally encompassed in the scope of invention of the present application. Further, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

First, a display device to according to this embodiment will be described in detail.

Figure 1:
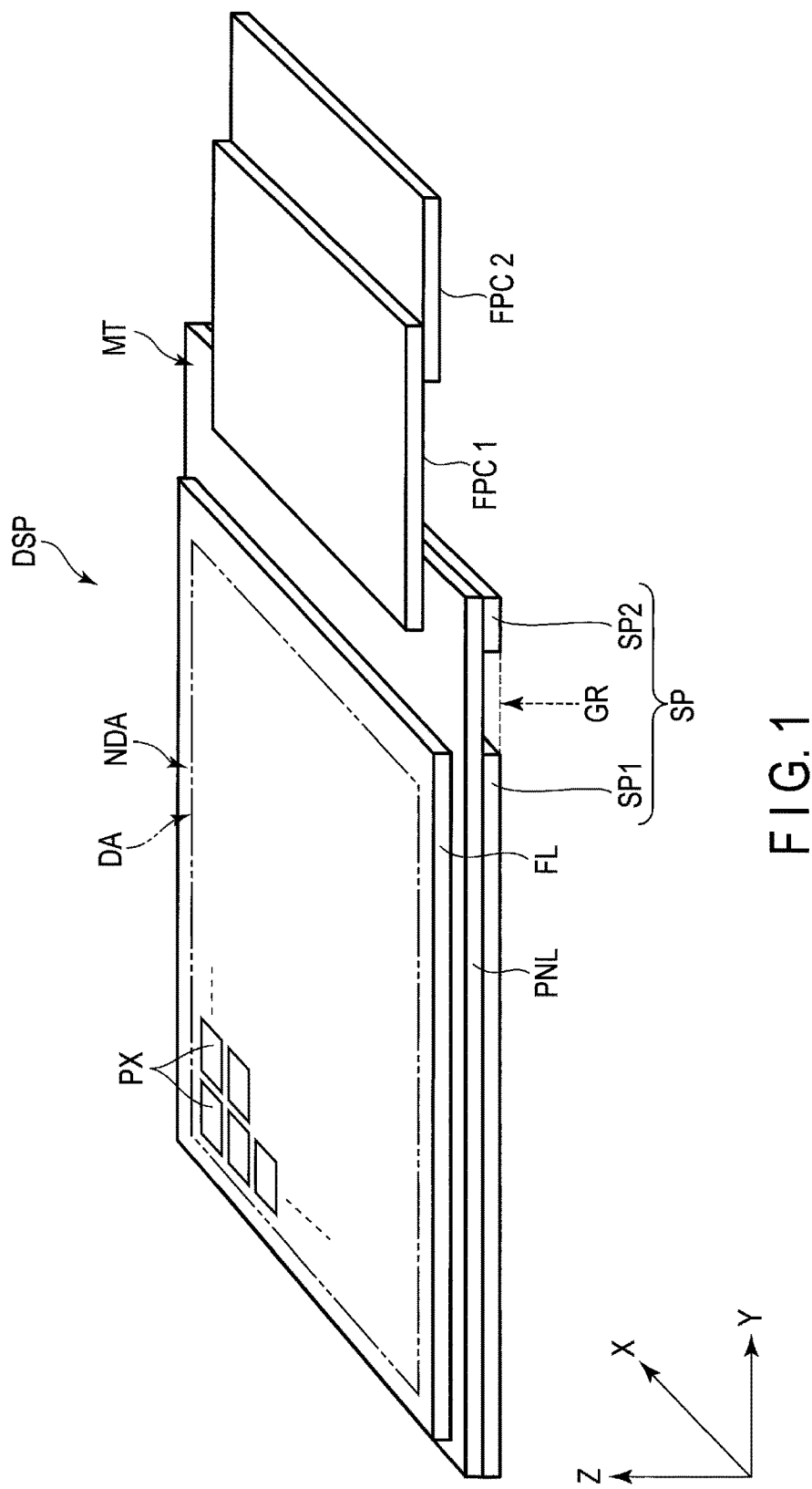
FIG. 1 is a perspective view of a configuration of a display device to according to this embodiment.

FIG. 1 is a perspective view illustrating a configuration of a display device DSP according to the embodiment. FIG. 1 shows a three-dimensional space defined by a first direction X, a second direction Y orthogonal to the first direction X, and a third direction Z orthogonal to the first direction X and the second direction Y. In the drawing, the first direction X, second direction Y and third direction Z orthogonally cross each other, but may cross each other at any angle other than 90 degrees. Hereinafter, the embodiment will be described in connection with the case where the display device DSP is an organic electroluminescent display device.

In this embodiment, the direction towards the tip of the arrow of the third direction Z is defined as "up", and the direction opposite to that towards the tip of the arrow of the third direction Z is defined as "down". Further, such expressions as "a second member above a first member" and "a second member under a first member" are meant that the second member may be in contact with the first member or may be spaced from the first member. In the latter case, a third member may be interposed between the first member and the second member.

As shown in FIG. 1, the display device DSP comprises a display panel PNL, an optical film FL, a wiring substrate FPC1, a wiring substrate FPC2, a support substrate SP and the like.

The display panel PNL includes a display area DA which displays images and a non-display area NDA surrounding the display area DA. The display panel PNL includes a plurality of pixels PX in the display area DA. The pixels PX are arranged in a matrix along the first direction X and the second direction Y.

The optical film FL is disposed above the display panel PNL. In the example illustrated, four side edges of the optical film FL are located on a display area DA side along the third direction Z with respect to four side edges of the display panel PNL. In other words, a length of the side edges of the optical film FL, which are parallel to the first direction X is less than that of the side edges of the display panel PNL, which are parallel to the first direction X. Further, a length of the side edges of the optical film FL, which are parallel to the second direction Y is less than that of the side edges of the display panel PNL, which are parallel to the second direction Y. That is, in an X-Y plane defined by the first direction X and the second direction Y, the area of the optical film FL is less than that of the display panel PNL.

The display panel PNL includes a mounting portion MT extending outwards from a region thereof, which overlaps the optical film FL. In the example illustrated, the wiring substrate FPC1 is mounted above the mounting portion MT in the non-display area NDA. In the example illustrated, a length of side edges of a wiring substrate 1, which are parallel to the first direction X is less than that of side edges of the display panel PNL, which are parallel to the first direction X, but they may be substantially the same. The display panel PNL and the wiring substrate FPC1 are electrically connected to each other. The wiring substrate FPC2 is disposed under the wiring substrate FPC1 and is electrically connected thereto. The wiring substrate FPC2 overlaps a side edge on an opposite side to the side edge of the wiring substrate FPC1, which overlaps the display panel PNL. Note that the wiring substrate FPC2 may be disposed above the wiring substrate FPC1.

The support substrate SP is attached under the display panel PNL. The support substrate SP includes a first support substrate SP1 and a second support substrate SP2. The first support substrate SP1 and the second support substrate SP2 are spaced from each other. The first support substrate SP1 overlaps the display area DA along the third direction Z. The second support substrate SP2 overlaps the non-display area NDA and the mounting portion MT along the third direction Z. The display device DSP comprises a groove portion GR between the first support substrate SP1 and the second support substrate SP2.

Figure 2:
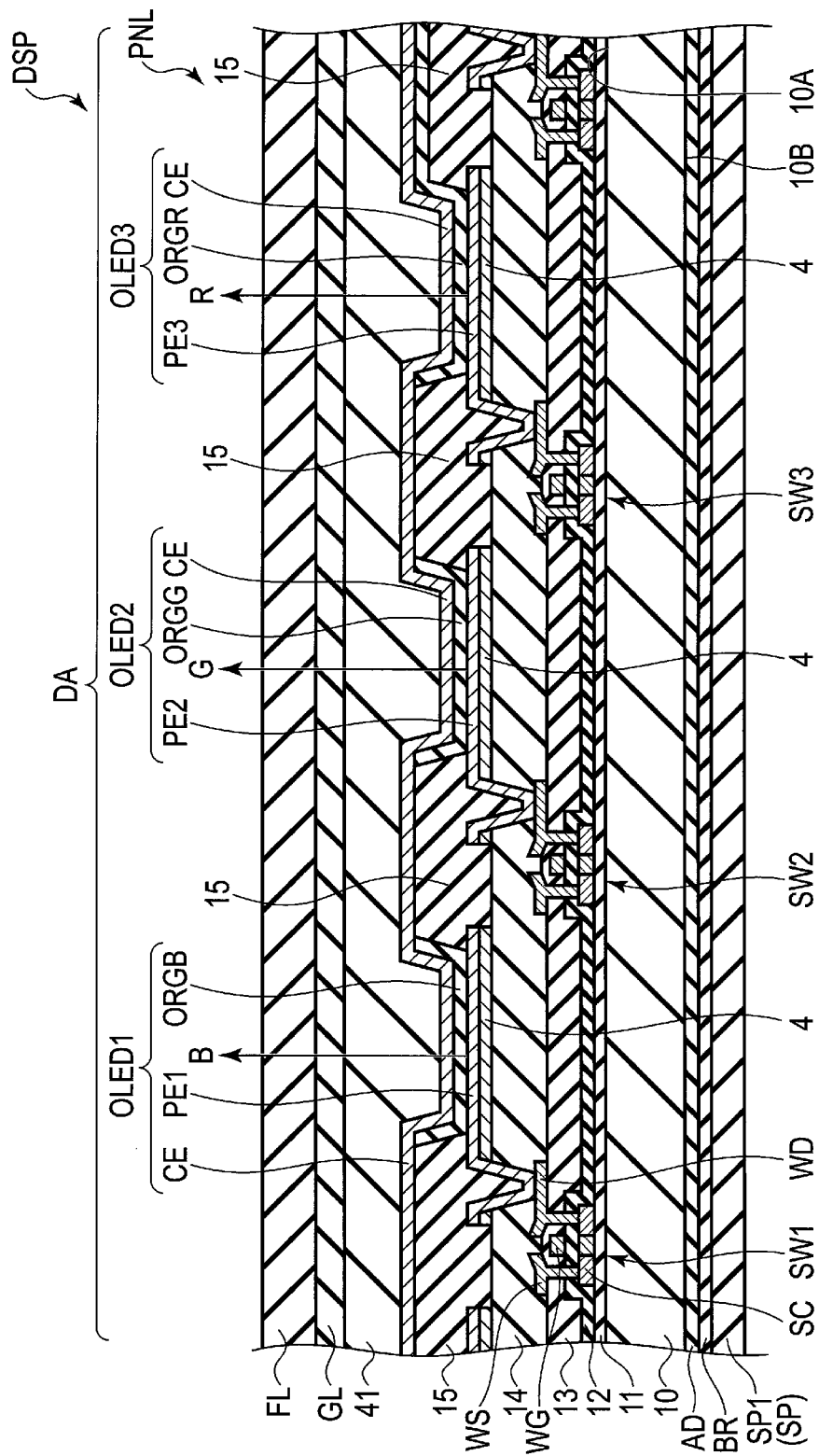
FIG. 2 is a cross-sectional view of a display area of the display device shown in FIG. 1.

FIG. 2 is a cross-sectional view of a display area DA of the display device DSP of FIG. 1.

As shown in FIG. 2, the display panel PNL comprises an insulating substrate 10, switching elements SW1, SW2 and SW3, a reflective layer 4, organic EL devices OLED1, OLED2 and OLED3, a sealing layer 41, a support substrate SP, an adhesive member GL, an optical film FL, an adhesive layer AD, a barrier layer BR and the like.

The first insulating substrate 10 is formed from an organic insulating material, for example, polyimide. The first insulating substrate 10 comprises a first surface 10A and a second surface 10B on an opposite side to the first surface 10A. The first insulating substrate 10 is covered by the first insulating film 11.

The switching elements SW1, SW2 and SW3 are formed on the first insulating film 11. In the example illustrated, the switching elements SW1, SW2 and SW3 are formed from top-gate thin film transistors, but they may be of a bottom gate type. The switching elements SW1, SW2 and SW3 are identical to each other in structure, and therefore the structure will be described in detail focusing on the switching element SW1. The switching element SW1 comprises a semiconductor layer SC formed on the first insulating film 11. The semiconductor layer SC is covered by the second insulating film 12. The second insulating film 12 is disposed also on the first insulating film 11.

A gate electrode WG of the first insulating film 11 is formed on the second insulating film 12 and is located immediately above the semiconductor layer SC. The gate electrode WG is covered by a third insulating film 13. The third insulating film 13 is disposed also on the second insulating film 12.

The first insulating film 11, second insulating film 12, and third insulating film 13 are inorganic insulating films each formed from an inorganic material such as silicon oxide or silicon nitride.

A source electrode WS and a drain electrode WD of the switching element SW1 are formed on the third insulating film 13. The source electrode WS and the drain electrode WD are electrically connected to the semiconductor layer SC via contact holes penetrating the second insulating film 12 and the third insulating film 13, respectively. The switching element SW1 is covered by a fourth insulating film 14.

The fourth insulating film 14 is disposed also on the third insulating film 13. The fourth insulating film 14 is formed of, for example, an organic material such as transparent resin.

The reflective layer 4 is formed on, for example, the fourth insulating film 14. The reflective layer 4 is formed of a highly reflective metal material such as aluminum or silver. Note that an upper surface of the reflective layer 4 may be a flat surface, or may be an uneven surface to impart light scattering properties.

The organic EL devices OLED1 to OLED1 are formed on the fourth insulating film 14. That is, the organic EL devices OLED1 to OLED3 are located between the insulating substrate 10 and the optical film FL. In the example illustrated, the organic EL device OLED1 is electrically connected to the switching element SW1, the organic EL device OLED2 electrically connected to the switching element SW2 and the organic EL device OLED3 electrically connected to the switching element SW3. The organic EL devices OLED1 to OLED3 are configured to be of a top emission type, which emits red light, blue light and green light, respectively, toward the optical film FL. The organic EL devices OLED1 to OLED3 are of the same structure. In the example illustrated, the organic EL devices OLED1 to OLED3 are partitioned by ribs 15 from one another.

The organic EL device OLED1 comprises a pixel electrode PE1 formed on the reflective layer 4. The pixel electrode PE1 is brought into contact with the drain electrode WD of the switching element SW1 so as to be electrically connected to the switching element SW1. Similarly, the organic EL device OLED2 comprises a pixel electrode PE2 electrically connected to the switching element SW2, and the organic EL device OLED3 comprises a pixel electrode PE3 electrically connected to the switching element SW3. The pixel electrodes PE1, PE2 and PE3 are formed from, for example, a transparent conductive material such as indium tin oxide (ITO) or indium zinc oxide (IZO).

For example, the organic EL device OLED1 comprises an organic emitting layer ORGB which emits blue light, the organic EL element OLED2 comprises an organic emitting layer ORGG which emits green light, and the organic EL device OLED3 comprises an organic emitting layer ORGR which emits red light. The organic emitting layer ORGB is located on a positive electrode PE1, the organic emitting layer ORGG is located on a positive electrode PE2, and the organic emitting layer ORGR is located on a positive electrode PE3. The organic EL devices OLED1 to OLED3 share a common electrode CE. The common electrode CE is located on the organic emitting layers ORGB, ORGG and ORGR. The common electrode CE is located also on the ribs 15. Of the pixel electrode PE and the common electrode CE, one is a positive electrode, and the other is a negative electrode. The common electrode CE is formed from, for example, a transparent conductive material such as ITO or IZO.

The sealing layer 41 covers over the organic EL devices OLED1, OLED2 and OLED3. The sealing layer 41 seals the member disposed between the insulating substrates 10 and itself. The sealing layer 41 suppresses the entering of oxygen and moisture into the organic EL devices OLED1, OLED2 and OLED3 to prevent degradation thereof. The sealing layer 41 may be formed from a multi-layer body of an inorganic film and an organic film.

The optical film FL is located on the sealing layer 41 and adhered to the sealing layer 41 with the adhesive member GL. The optical film FL contains, for example, a polarizer or the like. The adhesive member GL is formed from, for example, any one of acrylic materials, epoxy materials and polyimides. In this embodiment, adhesion is meant to fix two members and the adhesive member GL may be a tacky agent.

The support substrate SP is adhered to the insulating substrate 10 on an opposite side to the optical film FL. That is, the support substrate SP is disposed on the second surface 10B side of the insulating substrate 10. The support substrate SP is adhered to the insulating substrate 10 by the adhesive layer AD. The adhesive layer AD is located between the insulating substrate 10 and the support substrate SP. A preferable example of the material for the support substrate SP is a type having excellent properties in heat resistance, gas shielding, moisture-proof and mechanical strength, and also inexpensive. The support substrate SP should have a thermal resistance to such a degree that it is not deteriorated or deformed at a processing temperature, for example, in the steps of manufacturing the display device DSP. Further, the support substrate SP should have a strength higher than that of the insulating substrate 10, for example, so as to function as a support layer for suppressing the display panel PNL from being curved while no stress being applied from outside. Furthermore, the support substrate SP should have a moisture proof to suppress the entering of moisture and the like to the insulating substrate 10 and a gas shielding property to suppress the entering of gas and the like. The support substrate SP is, for example, a film formed of polyethylene terephthalate.

The barrier layer BR is located between the support substrate SP and the adhesive layer AD, and is in contact with the adhesive layer AD. The barrier layer BR is, for example, an inorganic film. The barrier layer BR does not absorb moisture more than the support substrate SP. Therefore, the entering of moisture from the support substrate SP side can be suppressed.

In the display device DSP having such a configuration described above, when the organic EL devices OLED1 to OLED3 emit light, the organic EL device OLED1 emits blue light, the organic EL device OLED2 emits green light and the organic EL device OLED3 emits red light. Thus, the color display of the display device DSP is realized.

A pixel PX shown in FIG. 1 is the minimum unit which forms, for example, a color image, and comprises organic EL devices OLED1 to OLED3 described above.

In the configuration example described above, the organic EL devices OLED1 to OLED3 respectively contain the organic emitting layer ORGR which emits blue light, the organic emitting layer ORGB which emits green light, and the organic emitting layer ORGG which emits red light, but the configuration is not limited to this. The organic EL devices OLED1 to OLED3 may contain a common organic emitting layer. In this case, the organic EL devices OLED1 to OLED3 emit white light, for example. In such a configuration example, a color filter layer is disposed on the sealing layer 41.

FIG. 3A is a plan view showing the display panel PNL according to this embodiment, which illustrates the positions of the first support substrate SP1 and the second support substrate SP2 relative to each other.

FIG. 3A indicates the first support substrate SP1 by downward-sloping hatch lines. The first support substrate SP1 overlaps the display area DA in plan view. The first support substrate SP1 also overlaps the optical film FL in plan view. A width W11 of the film FL along the first direction X is less than a width W21 of the first support substrate SP1 along the first direction X, and a width W12 of the film FL along the second direction Y is less than a width W22 of the first support substrate SP1 along the second direction Y. The second support substrate SP2 is indicated by upward-sloping hatch lines. The second support substrate SP2 extends along the first direction X.

As will be described later, the display device DSP is bent, for example, when to be accommodated in a case such as an electronic device. More specifically, the bend area BA between the first support substrate SP1 and the second support substrate SP2 is bent so that the wiring substrates FPC1 and FPC2 shown in FIG. 1 are located under the display area DA. That is, the region where the trench portion GR is formed in plan view includes the bend area BA.

The display panel PNL comprises a plurality of pad electrodes PD for externally connecting to electrical circuits. The pad electrodes PD overlap the second support substrate SP2 in plan view, and are arranged along the first direction X. A plurality of signal wiring lines 6 are connected to the pad electrodes PD, respectively, and are arranged along the first direction X to extend along the second direction Y in the region which overlap the groove portion GR.

Further, the display panel PNL comprises end portions E1, E2, E3 and E4. The end portions E1 and E2 extend along the second direction Y. The end portions E3 and E4 extend along the first direction X.

FIG. 3B is a diagram showing a state where the bend area BA is bent in the display device DSP according to this embodiment.

The bend area BA is bent so that the display area DA of the display panel PNL and the wiring substrate FPC1 oppose each other. A base 50 is disposed between the display area DA and the wiring substrate FPC1. An adhesive layer 51 is disposed between the second support substrate SP2 and the base 50 to attach them together. Further, the adhesive layer 52 is disposed between the first support substrate SP1 and the base 50 to attach them together. The adhesive layers 51 and 52 are, for example, double-sided tapes.

Figure 4:
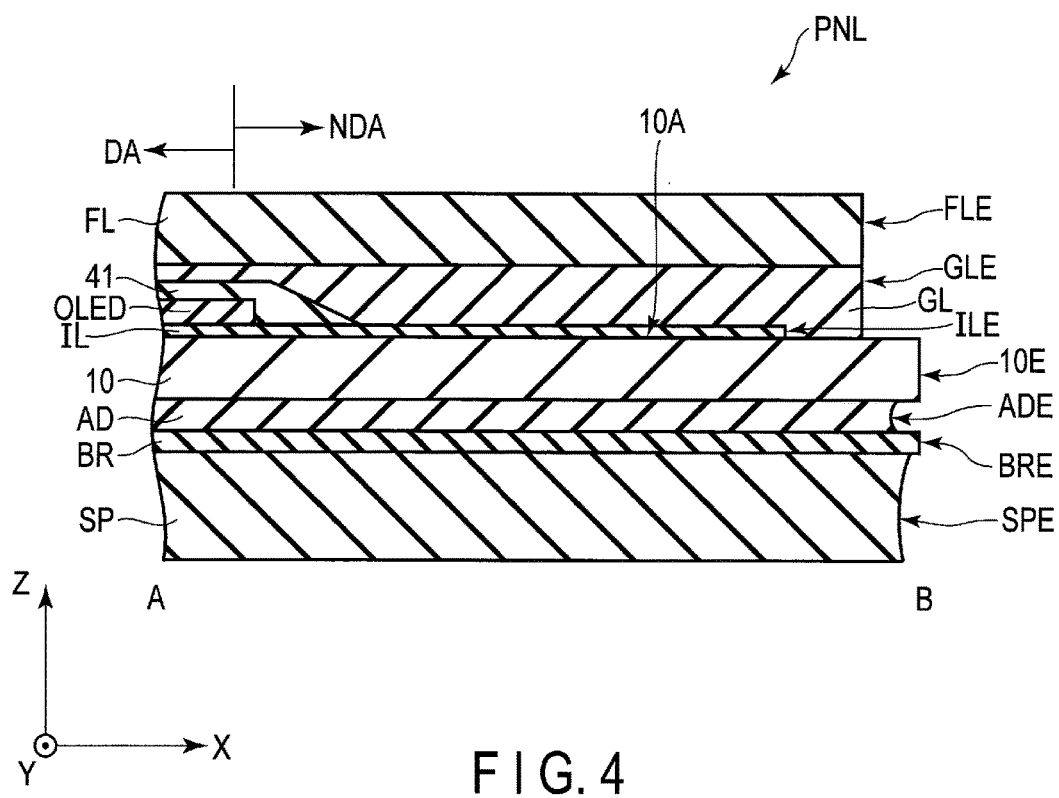
FIG. 4 is a cross-sectional view of the display panel taken along line A-B shown in FIG. 3A.

FIG. 4 is a cross-sectional view of the display panel PNL taken along line A-B shown in FIG. 3A. Here, only main members in this embodiment are illustrated.

An end portion ADE of the adhesive layer AD is located on the display area DA side as compared to an end portion 10E of the insulating substrate 10. Further, the end portion ADE is located on the display area DA side as compared to an end portion BRE of the barrier layer BR. Furthermore, the end portion ADE is located on the display area DA side as compared to an end portion SPE of the support substrate SP.

Here, the first insulating film 11, second insulating film 12 and third insulating film 13 shown in FIG. 2 are collectively called in general term as an inorganic insulating film IL. The inorganic insulating film IL is disposed on the first surface 10A side. An end portion ILE of the inorganic insulating film IL is located on the display area DA side as compared to the end portion 10E of the insulating substrate 10. Further, an end portion GLE of the adhesive member GL and an end portion FLE of the optical film FL are located on the display area DA side as compared to the end portion 10E.

In the example illustrated, the end portion 10E, the end portion BRE and end portion SPE are located on the same plane and form the end portion E2 of the display panel PNL shown in FIG. 3A. Note that the end portion 10E, the end portion BRE and the end portion SPE are not necessarily located on the same plane, and in such a case, an end portion located on the outermost portion forms the end portion E2 of the display panel PNL. Further, in the end portions E1, E3 and E4 as well, shown in FIG. 3A, the end portion ADE is located on the display area DA side as compared to the end portion 10E, the end portion BRE and the end portion SPE similarly as shown in FIG. 4.

Next, part of the process of manufacturing the display device of this embodiment will be described with reference to FIGS. 5 to 10. FIGS. 5 to 10 illustrate a processing step of shaping the outer form of the display panel PNL. In this embodiment, the cutting-out of the display panel PNL is performed by cutting the optical film FL, the support substrate SP and the insulating substrate 10 in this order.

Figure 5:
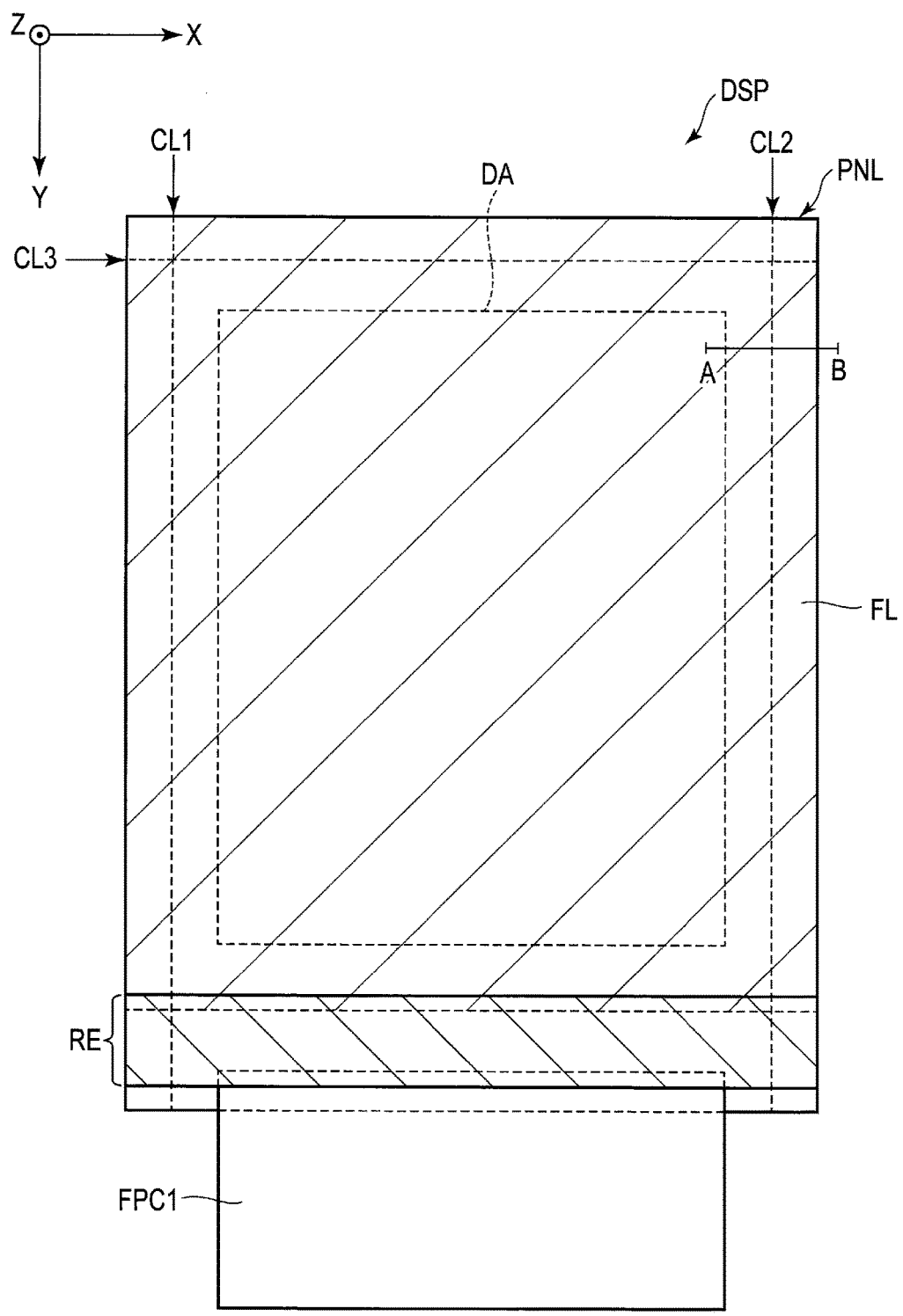
FIG. 5 shows a process of cutting an optical film.

FIG. 5 shows a step of cutting the optical film FL.

First, as shown in FIG. 5, a display device DSP is prepared. The optical film FL is disposed in a region indicated by upward-sloping hatch lines, and overlaps the display area DA in plan view. Further, the display device DSP comprises a resin layer RE. The resin layer RE is disposed in a region indicated by downward-sloping hatch lines, and extends along the first direction X. The resin layer RE has overlapped with wiring substrate FPC1 and the optical film FL.

Next, the optical film FL is cut along cut lines CL1, CL2 and CL3 by irradiation of a laser beam. The cut lines CL1 and CL2 extend along the second direction Y and overlap the optical film FL and the resin layer RE. The cut line CL3 extends along the first direction X and overlaps the optical film FL.

Figure 6:
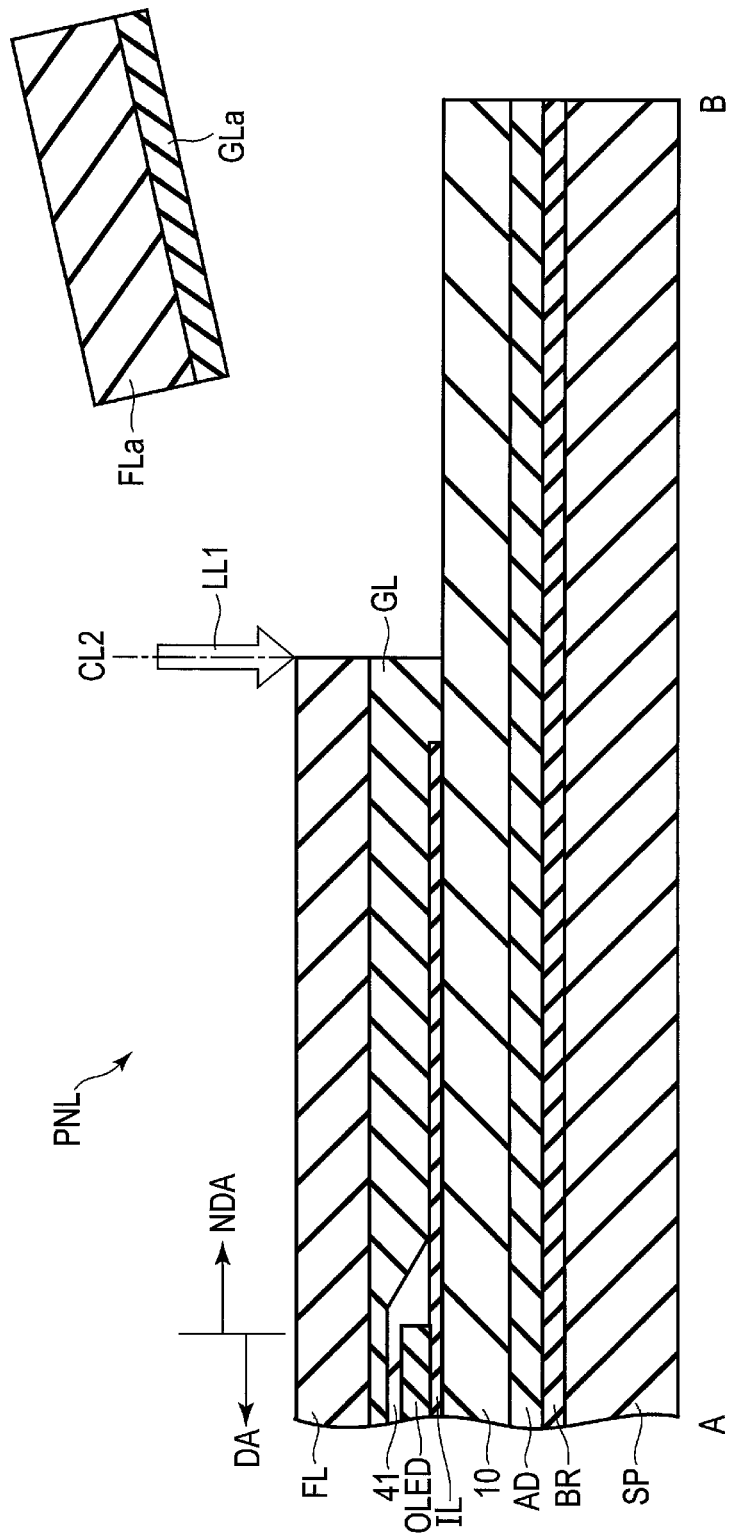
FIG. 6 is a cross-sectional view of the display panel taken along line A-B shown in FIG. 5.

FIG. 6 is a cross-sectional view of the display panel PNL taken along line A-B shown in FIG. 5. FIG. 6 illustrates the processing step shown in FIG. 5 by cross section.

By the irradiation of a laser beam LL1 along the cut line CL2, the optical film FL is cut to remove a part FLa of the optical film FL and a part GLa of the adhesive member GL.

FIG. 7 shows the processing step of cutting the support substrate SP.

Here, as shown in FIG. 7, a mother support substrate SPM for forming the first support substrate SP1 and the second support substrate SP2 is placed. The mother support substrate SPM is disposed in a region indicated by upward-sloping hatch lines. The mother support substrate SPM comprises an opening OP. The opening OP extends along the first direction X.

By the irradiation of a laser beam, the support substrate SP is cut along cut lines CL11, CL12 and CL13. The cut lines CL11 and CL12 extend along the second direction Y and the cut line CL13 extends along the first direction X. The cut lines CL11, CL 12 and CL13 overlap the mother support substrate SPM. Further, the cut lines CL1 and CL2 overlap the opening OP. That is, when the mother support substrate SPM is cut along the cut lines CL11 and CL12, the first support substrate SP1 and the second support substrate SP2 are formed. Further, when the display panel PNL is cut along the cut lines CL11 and CL12, the trench portion GR is formed.

Note that, for example, the cut lines CL11, CL12, and CL13 may be superimposed on the cut lines CL1, CL2 and CL3 shown in FIG. 5, respectively, or they may be located on outer sides of the cut lines CL1, CL2 and CL3, respectively. That is, the outer form of the optical film FL may be smaller than the outer form of the support substrate SP.

Figure 8:
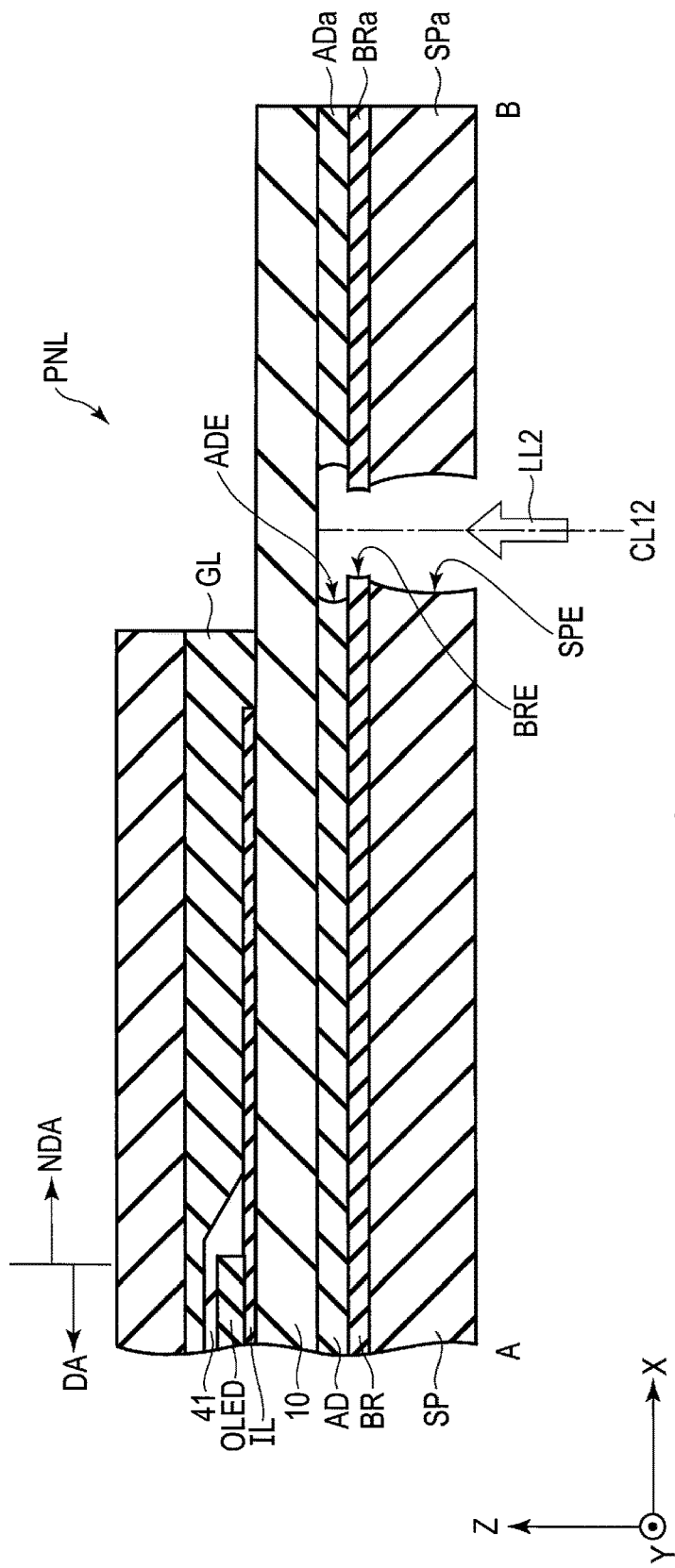
FIG. 8 is a cross-sectional view of the display panel taken along line A-B shown in FIG. 7.

FIG. 8 is a cross-sectional view of the display panel PNL taken along line A-B shown in FIG. 7. FIG. 8 illustrates the processing step shown in FIG. 7 by cross section.

With the irradiation of a laser beam LL2 along the cut line CL12, the support substrate SP is cut. Here, in this embodiment, the adhesive layer AD contains a wavelength absorbent. Therefore, the heat sensitivity of the adhesive layer AD can be improved, thereby making it possible to increase the amount of the adhesive layer AD removed with respect to the laser beam LL2. For example, in this embodiment, the laser beam LL2 has a wavelength of 266 to 10600 nm. More specifically, the laser beam LL2 has a wavelength of 266, 355, 532, 1064, 9300, 9600 or 10600 nm. In this embodiment, a wavelength absorbent optimal for the wavelength of the laser beam LL2 is employed.

The barrier layer BR does not absorb the laser beam LL2 more than the adhesive layer AD. At the time of irradiating the laser beam LL2, plasma and plume are generated, which make it easy to cut the adhesive layer AD perpendicularly to the irradiating direction of the laser beam LL2. In the example illustrated, the irradiating direction of the laser beam LL2 is parallel to the third direction Z. That is, the plasma and plume can cut the adhesive layer AD along the direction aligned with the X-Y plane. Thus, the end portion ADE of the adhesive layer AD retreats as compared to the end portion SPE of the support substrate SP and the end portion BRE of the barrier layer BR.

After cutting the support substrate SP by the irradiation of the laser beam LL2, a part SPa of the support substrate SP, a part BRa of barrier layer BR and a part ADa of adhesive layer AD are removed.

FIG. 9 shows the processing step of cutting the insulating substrate 10.

With the irradiation of a laser beam, the insulating substrate 10 is cut along cut lines CL21, CL22 and CL23. The cut lines CL21 and CL22 extend along the second direction Y and the cut line CL23 extends along the first direction X.

Note that, for example, the cut lines CL21, CL22 and CL23 may be superimposed on the cut lines CL1, CL2 and CL3 shown in FIG. 5, respectively, or they may be located on outer sides of the cut lines CL1, CL2 and CL3, respectively. That is, the outer form of the optical film FL may be smaller than the outer form of the insulating substrate 10.

The adhesive layer AD comprises end portions ADE1, ADE2 and ADE3. The end portion ADE1 is located on the display area DA side with respect to the cut line CL21. The end portion ADE2 is located on the display area DA side with respect to the cut line CL22. The end portion ADE3 is located on the display area DA side with respect to the cut line CL23. In other words, the end portions ADE1, ADE2 and ADE3 are not superimposed on the cut lines CL21, CL22 and CL23, respectively.

The inorganic insulating film IL comprises end portions ILE1, ILE2 and ILE3. The end portion ILE1 is located on the display area DA side with respect to the cut line CL21. The end portion ILE2 is located on the display area DA side with respect to the cut line CL22. The end portion ILE3 is located on the display area DA side with respect to the cut line CL23. In other words, the end portions ILE1, ILE2 and ILE3 are not superimposed on the cut lines CL21, CL22 and CL23, respectively.

Figure 10:
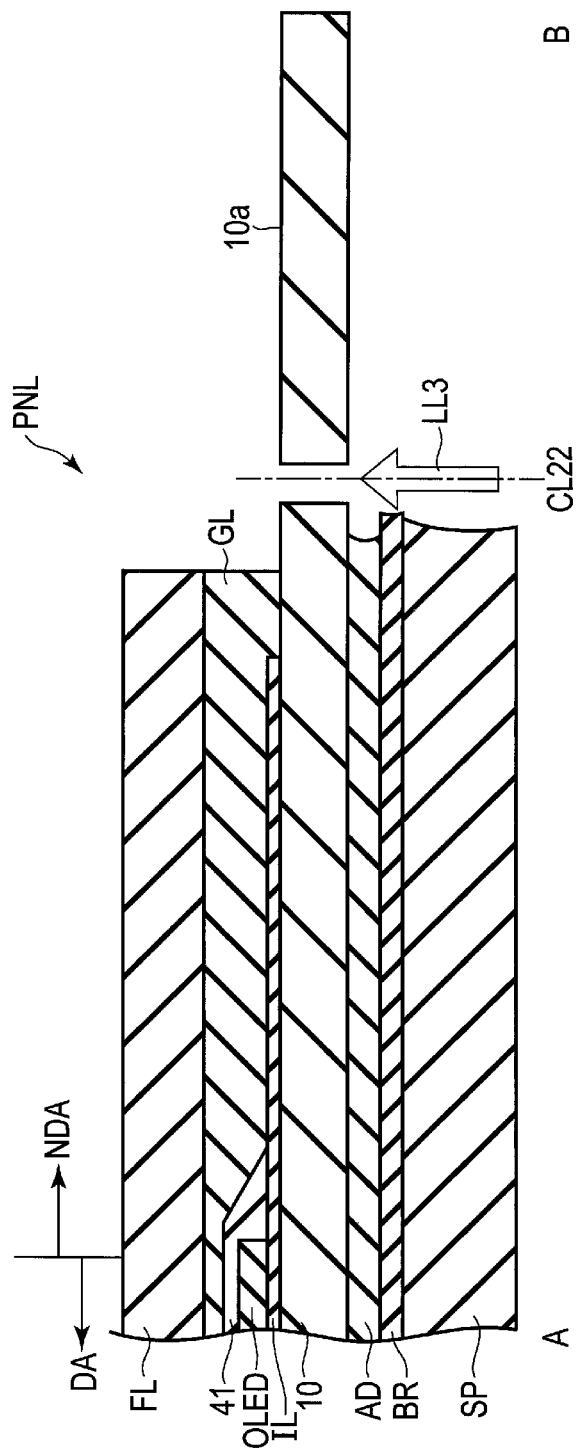
FIG. 10 is a cross-sectional view of the display panel taken along line A-B shown in FIG. 9.

FIG. 10 is a cross-sectional view of the display panel PNL taken along line A-B shown in FIG. 9. FIG. 10 illustrates the processing step shown in FIG. 9 by cross section.

With the irradiation of a laser beam LL3 along with the cut line CL22, the insulating substrate 10 is cut and a part 10a of the insulating substrate 10 is removed. As shown in FIG. 9, the inorganic insulating film I L is not placed on the cut line CL2, and therefore it is possible to suppress cracking in the display panel PNL, which may occur while irradiating the laser beam LL3.

Further, the conditions of the laser beam LL3 used to cut the insulating substrate 10 are optimized for cutting the insulating substrate 10. For this reason, when the laser beam LL3 hits the adhesive layer AD, reflection and scattering may possibly occur due to the difference in refractive index and the like, thereby creating cutting errors such as incomplete cutting of the insulating substrate 10. In this embodiment, as shown in FIG. 9, the adhesive layer AD is not placed on the cut line CL22, and therefore it is possible to prevent the adhesive layer AD from interfering with the laser beam LL3. Thus, the occurrence of cutting error in the insulating substrate 10 can be suppressed.

Note that FIGS. 5 to 10 illustrate processing steps of shaping the outer form of the display panel PNL, but these step may as well be used to cut the display panel PNL into individual pieces after forming the structural members on the large-scale mother substrate.

According to this embodiment, the display panel PNL comprises the barrier layer BR brought into contact with the adhesive layer AD. The barrier layer BR does not absorb the laser beam LL2 more than the adhesive layer AD. Further, the adhesion layer AD contains the wavelength absorbent. With this configuration, the laser beam LL2 tends to cut the adhesive layer AD perpendicularly with respect to the irradiating direction of the laser beam LL2 in the step of cutting the support substrate SP. That is, the end portion ADE of the adhesive layer AD retreats to the display area DA side as compared to the end portion SPE of the support substrate SP and the end portion BRE of the barrier layer BR. Thus, it is possible to avoid the adhesive layer AD from leaving a residual on the cut line when cutting the insulating substrate 10. As a result, cutting error of the insulating substrate 10 can be prevented, thereby suppressing the lowering of the production yield.

The above-described embodiment can be applied not only to organic electroluminescent display devices, but also to liquid crystal displays. In such a case, the display panel PNL is a liquid crystal display panel comprising, for example, a first substrate, a second substrate disposed above the first substrate and a liquid crystal layer held between the first substrate and the second substrate. When the display panel PNL is a liquid crystal display panel, it may be of a reflective type which displays images by selectively reflecting light entering from the second substrate side, or a transmissive type which displays images by selectively transmitting light entering from the first substrate side. Note that the main structure of this embodiment is substantially the same if the display device DSP is a liquid crystal display.

As described above, according to the embodiment, a display device can be obtained, in which the lowering of the production yield is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate comprising a first surface on which a plurality of pixels are disposed and a second surface on an opposite side to the first surface;
a support substrate disposed on the second surface side of the insulating substrate; and
an adhesive layer located between the insulating substrate and the support substrate,
wherein the display device comprises a display area corresponding to an area on which the plurality of pixels are arranged on the insulating substrate,
a display surface of the display device is disposed on the first surface side of the insulating substrate, and
an end portion of the adhesive layer is located closer to the display area than an end portion of the insulating substrate.

2. A display device comprising:
an insulating substrate comprising a first surface on which a plurality of pixels are disposed and a second surface on an opposite side to the first surface;
a support substrate disposed on the second surface side of the insulating substrate;
an adhesive layer located between the insulating substrate and the support substrate; and
a barrier layer located between the support substrate and the adhesive layer and in contact with the adhesive layer,
wherein the display device comprises a display area on which the plurality of pixels are arranged, and
an end portion of the adhesive layer is located closer to the display area than an end portion of the insulating substrate.

3. The device of claim 2, wherein
the barrier layer less absorbs a laser beam than the adhesive layer.

4. The device of claim 2, wherein
the barrier layer less absorbs moisture than the support substrate.

5. The device of claim 2, wherein
the end portion of the adhesive layer is located closer to the display area than an end portion of the barrier layer.

6. The device of claim 2, wherein
the barrier layer is an inorganic film.

7. The device of claim 1, wherein
the end portion of the adhesive layer is located closer to the display area than an end portion of the support substrate.

8. The device of claim 1, wherein
the support substrate is formed of polyethylene terephthalate.

9. The device of claim 1, further comprising:
an inorganic insulating film disposed on the first surface side of the insulating substrate,
wherein
an end portion of the inorganic insulating film is located closer to the display area than an end portion of the support substrate.

10. The device of claim 1, further comprising:
a film disposed on the first surface side of the insulating substrate; and
an adhesive member to which the film is attached,
wherein
an end portion of the film and an end portion of the adhesive member are located closer to the display area than the end portion of the insulating substrate.

11. The device of claim 10, wherein,
the support substrate comprises a first support substrate which overlaps the display area and a second support substrate spaced from the first support substrate, and
a width of the film along the first direction is less than a width of the first support substrate along the first direction, and a width of the film along a second direction which crosses the first direction is less than a width of the first support substrate along the second direction.

12. The device of claim 11, comprising:
a bend area between the first support substrate and the second support substrate.

\* \* \* \* \*